(12) United States Patent
Oda et al.

(10) Patent No.: US 6,475,844 B1
(45) Date of Patent: Nov. 5, 2002

(54) FIELD EFFECT TRANSISTOR AND METHOD OF MANUFACTURING SAME

(75) Inventors: Hidekazu Oda; Tomohiro Yamashita; Shuichi Ueno, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/629,485

(22) Filed: Jul. 31, 2000

Related U.S. Application Data

(62) Division of application No. 09/346,999, filed on Jul. 2, 1999, now Pat. No. 6,130,463.

(30) Foreign Application Priority Data

Feb. 1, 1999 (JP) .............................................. 11-23973

(51) Int. Cl.$^7$ .............................................. H01L 29/72
(52) U.S. Cl. ...................... 438/199; 438/586; 438/655; 438/664; 438/595
(58) Field of Search .................................. 438/199, 166, 438/218, 230, 231, 233, 303, 592, 586, 655, 657, 665, 674; 257/384, 306, 770, 344, 253, 376, 346

(56) References Cited

U.S. PATENT DOCUMENTS

| | | | | |
|---|---|---|---|---|
| 4,986,544 A | * | 1/1991 | Lu et al. ...................... 437/200 |
| 5,134,085 A | * | 7/1992 | Gilgen et al. .................. 437/52 |
| 5,208,472 A | * | 5/1993 | Su et al. ...................... 257/344 |
| 5,444,018 A | * | 8/1995 | Yost et al. .................... 437/190 |
| 5,463,241 A | * | 10/1995 | Kubo ........................... 257/376 |
| 5,482,895 A | * | 1/1996 | Hayashi et al. ............. 437/200 |
| 5,567,629 A | * | 10/1996 | Kubo ........................... 437/24 |
| 5,576,244 A | * | 11/1996 | Hayashi et al. ............. 437/200 |
| 5,608,249 A | * | 3/1997 | Gonzalez ..................... 257/306 |
| 5,641,983 A | * | 6/1997 | Kato et al. ................... 257/412 |
| 5,696,017 A | * | 12/1997 | Ueno ........................... 437/60 |
| 5,818,092 A | * | 10/1998 | Bai et al. ..................... 257/388 |
| 5,861,340 A | * | 1/1999 | Bai et al. ..................... 438/592 |
| 5,902,121 A | * | 5/1999 | Goto ........................... 438/199 |
| 5,915,197 A | * | 6/1999 | Yamanaka et al. .......... 438/586 |
| 5,960,270 A | * | 9/1999 | Misra et al. ................. 438/197 |
| 6,051,475 A | * | 4/2000 | Ho et al. ..................... 438/396 |
| 6,074,960 A | * | 6/2000 | Lee et al. .................... 438/749 |
| 6,130,463 A | * | 10/2000 | Oka et al. .................... 257/384 |
| 6,271,549 B1 | * | 8/2001 | Hamanaka ................... 257/253 |

FOREIGN PATENT DOCUMENTS

| | | | | |
|---|---|---|---|---|
| JP | 55-83264 | * | 6/1980 | ................. 257/384 |
| JP | 1-264257 | | 10/1989 | |

* cited by examiner

*Primary Examiner*—Olik Chaudhuri
*Assistant Examiner*—Laura Schillinger
(74) *Attorney, Agent, or Firm*—Oblon, Spivak, McClelland, Maier & Neustadt, P.C.

(57) ABSTRACT

A silicided region (11a) is formed in part of a surface of a gate electrode (3a) which is far from a storage node when a diffusion region (7a) is connected to a bit line and a diffusion region (8a) is connected to the storage node. A silicided region (12a) is formed in a surface of the diffusion region (7a) connected to the bit line. A MOSFET which suppresses a leakage current from the storage node to the gate electrode and decreases the resistance of the diffusion region connected to the bit line and the resistance of said gate electrode is provided.

13 Claims, 8 Drawing Sheets

FIELD EFFECT TRANSISTOR AND METHOD OF MANUFACTURING SAME

This application is a division of U.S. appl. Ser. No. 09/346,999, filed Jul. 2, 1999 now U.S. Pat. No. 6,130,463.

BACKGROUND OF THE INVENTION

1. Field of the Invention

The present invention relates to a field effect transistor (referred to hereinafter as a-MOSFET) subjected to a silicidation process and a method of manufacturing the same.

2. Description of the Background Art

In the past, logic devices such as microprocessors and memory devices represented by a DRAM have been manufactured separately. In recent years, however, semiconductor devices have been more highly integrated, and such separately manufactured logic and memory devices have accordingly been mounted in a single chip (referred to as a hybrid logic-memory device).

Each of the logic and memory devices included in the hybrid logic-memory device comprises transistors. Most of the transistors in either device are MOSFETs. However, there is a difference in required characteristics between MOSFETs constituting a logic circuit and MOSFETs constituting a memory device. Therefore, there exists a difference in construction therebetween.

With reference to FIG. 10A, a MOSFET of a logic device comprises a well $2c$ in a semiconductor substrate not shown, a gate electrode $3c$, a gate insulating film $4c$ and sidewalls 6 which are formed on the well $2c$, and source/drain diffusion regions $7c$ and $8c$ formed in the well $2c$. In many cases, the MOSFET of the logic device further comprises regions $11c$, $12c$, $13c$ of a compound of metal such as cobalt and silicon, i.e. silicide, which are formed in the surfaces of the gate electrode $3c$ and the source/drain diffusion regions $7c$, $8c$ since the MOSFET of the logic device which is required to have a high driving capability must reduce the parasitic resistance of an electrode portion by means of the silicidation using metal. Silicidation of the surface of a diffusion region also has the effect of preventing spikes which are prone to occur when a contact interconnect line to the diffusion region is formed.

On the other hand, a MOSFET of a memory device (FIG. 10B) is similar to the MOSFET of the logic circuit in that it comprises a gate electrode $3a$, a gate insulating film $4a$ and sidewalls 6 which are formed on a well $2a$, and source/drain diffusion regions $7a$, $8a$ formed in the well $2a$. The MOSFET of the memory device, however, is constructed such that only the gate electrode $3a$ has a silicided region $23a$, unlike the MOSFET of the logic device in which each of the electrode portions has a silicided region.

The gate electrode $3a$ is silicided for the above described reasons. The other electrode portions are not silicided to prevent a leakage current which is prone to flow from the source/drain diffusion regions $7a$, $8a$ to the well $2a$. A flow of the leakage current causes electric charges to flow out of a storage node of a capacitor connected to one of the source/drain diffusion regions $7a$ and $8a$, resulting in the decrease in the ability of the capacitor to hold information. Silicidation using metal forms a new energy level in a band gap of silicon to increase the number of carriers in the electrode portions, thereby causing a leakage current to readily flow. For this reason, the source/drain diffusion regions $7a$ and $8a$ are not silicided.

A method of manufacturing MOSFETs of the above-mentioned hybrid logic-memory device is described with reference to FIGS. 11 through 16. Two regions in a right half of FIGS. 11 through 16 are defined as a memory device region as labeled "DRAM" in FIG. 11, and two regions in a left half thereof are defined as a logic device region as labeled "LOGIC" in FIG. 11. The process of formation of both N-type and P-type MOSFETs in each of the memory and logic device regions is illustrated.

Initially, isolation regions 5 are formed on the semiconductor substrate 1 by the LOCOS (LOCal Oxidation of Silicon) process and the like. A photoresist not shown is applied to the surface of the semiconductor substrate 1 and patterned. Using the patterned photoresist as a mask, impurities are implanted into the semiconductor substrate 1 to form the P-type wells $2a$ and $2c$. Then, the photoresist is removed. likewise, N-type wells $2b$ and $2d$ are formed (FIG. 11).

Next, the MOSFETs of the memory device are formed. Thermal oxidation of the surface of the wells $2a$ to $2d$ forms gate insulating films $4a$ to $4d$, respectively. Phosphorus-containing polycrystalline silicon, for example, is deposited on the entire surfaces of the gate insulating films $4a$ to $4d$ and the isolation regions 5 by the low pressure CVD (referred to hereinafter as "LPCVD") process. Tungsten, for example, is deposited on the phosphorus-containing polycrystalline silicon. Then, heat treatment is performed to form a compound of tungsten and polycrystalline silicon, i.e. tungsten silicide. A silicon oxide film serving as a mask for the patterning of the polycrystalline silicon and tungsten silicide into the form of gate electrodes is deposited by the CVD process. A photoresist is applied and patterned. Using the photoresist as a mask, the silicon oxide film is etched. The photoresist is then removed. This provides patterned silicon oxide films $24a$ and $24b$. Using the silicon oxide films $24a$ and $24b$ as a mask, etching is performed on the underlying structure to form a gate electrode including polycrystalline silicon $3a$ and tungsten silicide $23a$ and a gate electrode including polycrystalline silicon $3b$ and tungsten silicide $23b$ in the memory device region (FIG. 12). Such silicided polycrystalline silicon used for a gate electrode is referred to as polycide.

The N-type well $2b$ in the memory device region and the entire logic device region are covered with a photoresist. Phosphorus ions, for example, are implanted into the P-type well $2a$ in the memory device region by the ion implantation technique to form $N^-$ source/drain diffusion regions $9a$ for use in an LDD (Lightly Doped Drain) structure. Then, the photoresist is removed. Likewise, the P-type well $2a$ and the entire logic device region are covered with a photoresist, and boron ions, for example, are implanted into the N-type well $2b$ to form $P^-$ source/drain diffusion regions $9b$ for use in the LDD structure.

Then, the photoresist is removed. A silicon oxide film is deposited on the surface of the semiconductor substrate 1 and then etched back to form the sidewalls 6. Parts of the gate insulating films $4a$ and $4b$ which lie outside the sidewalls 6 are etched away at the same time. Thereafter, the N-type well $2b$ and the entire logic device region are covered again with a photoresist, and phosphorus ions are implanted into the P-type well $2a$ to form the $N^+$ source/drain diffusion regions $7a$ and $8a$. Then, the photoresist is removed. The P-type well $2a$ and the entire logic device region are covered again with a photoresist, and boron ions are implanted into the N-type well $2b$ to form $P^+$ source/drain diffusion regions $7b$ and $8b$. Then, the photoresist is removed (FIG. 13).

Prior to the next step of forming the MOSFETs in the logic device region, an oxidation-resistant silicon nitride film 25 is formed to cover the entire memory device region so that oxidation does not proceed in the memory device region (FIG. 14).

For the formation of the MOSFETs in the logic device region, impurity-free polycrystalline silicon is initially deposited on the entire surface of the semiconductor substrate 1 by the LPCVD process. A photoresist is patterned so that only part of the polycrystalline silicon which overlies the P-type well 2c in the logic device region is exposed. Phosphorus ions are implanted into the exposed part of the polycrystalline silicon to form N-type polycrystalline silicon. Then, the photoresist is removed. Likewise, a photoresist is patterned so that only part of the polycrystalline silicon which overlies the N-type well 2d is exposed, and boron ions are implanted into the exposed part of the polycrystalline silicon to form P-type polycrystalline silicon. Then, the photoresist is removed. A photoresist pattern for gate electrode shaping is formed. Using the photoresist pattern, the polycrystalline silicon is etched to form the $N^+$ gate electrode 3c and a $P^+$ gate electrode 3d. Different types of impurities are implanted into the gate electrodes between the N-type and P-type MOSFETs so as to control the threshold voltage levels of the respective MOSFETs. The photoresist pattern is removed. In the same manner as in the memory device region, N source/drain diffusion regions 9c and $N^+$ source/drain diffusion regions 7c, 8c are formed in the P-type well 2c, and sidewalls 6 are formed on the P-type well 2c. Similarly, $P^-$ source/drain diffusion regions 9d and $P^+$ source/drain diffusion regions 7d, 8d are formed in the N-type well 2d, and the sidewalls 6 are formed on the N-type well 2d (FIG. 15).

The electrode portions of the logic device are silicided in the following manner. Cobalt, for example, is deposited on the surface of the semiconductor substrate 1 by the sputtering process. Heat treatment is performed to change the cobalt on the surfaces of the gate electrodes 3c, 3d and the source/drain diffusion regions 7c, 8c, 7d, 8d of the MOSFETs in the logic device region into cobalt silicide regions 11c, 12c, 13c, 11d, 12d, 13d. Unreacted cobalt remaining unsilicided is removed (FIG. 16). A silicon portion which is not exposed is not silicided in spite of heating. Such a portion silicided in a self-aligned manner is referred to as salicide (self aligned silicide).

Subsequently, the silicon nitride film 25 is removed, and the steps of forming an interlayer insulating film and forming interconnect lines are performed.

As above described, the MOSFETs constructed to conform to the logic device region and the memory device region, respectively, have conventionally been manufactured separately in the respective regions. However, the memory device region employs the polycide formation method whereas the logic device region employs the salicide formation method. This results in the increased number of process steps which are very complicated.

Further, cobalt silicide and nickel silicide which have a low resistivity are desirably used also for the gate electrodes of the MOSFETs of a memory device. However, a suitable method of removing these silicides have not yet been found, and the above-mentioned polycide formation method in which the entire surface of the substrate is silicided and patterned has not achieved the silicidation using cobalt and nickel.

Then, the use of the salicide formation method is desired when the MOSFETs in the memory device region are manufactured, as well as in the logic device region. Such a method of manufacturing a semiconductor device includes a technique disclosed in Japanese Patent Application Laid-Open No. P01-264257A (1989) which will be described below.

Initially, the isolation regions 5 are formed on the semiconductor substrate 1, and the wells 2a to 2d are formed (FIG. 11). The gate insulating films 4a to 4d are formed, and polycrystalline silicon is deposited on the entire surfaces of the gate insulating films 4a to 4d and the isolation regions 5 by the CVD process. A silicon nitride film is formed on the upper surface of the polycrystalline silicon. A photoresist is formed on the upper surface of the silicon nitride film and patterned. Using the photoresist, the gate electrodes 3a to 3d and silicon nitride films 26a to 26d are formed by etching (FIG. 17). Next, the source/drain diffusion regions 9a to 9d are formed using the silicon nitride films 26a to 26d and the gate electrodes 3a to 3d as a mask. Thereafter, a silicon oxide film is formed on the surface of the semiconductor substrate 1 by the CVD process, and the sidewalls 6 are formed on the side surfaces of the gate electrodes 3a to 3d by reactive ion etching (referred to hereinafter as REE). The source/drain diffusion regions 7a to 7d, 8a to 8d are formed using the silicon nitride films 26a to 26d, the gate electrodes 3a to 3d and the sidewalls 6 as a mask. Parts of the gate insulating films 4c and 4d which lie outside the sidewalls 6 and the silicon nitride films 26a to 26d are selectively removed. A high-melting-point metal film such as tungsten is deposited on the entire surface of the semiconductor substrate 1 by sputtering. Thereafter, heat treatment is performed to silicide an exposed silicon surface. Thus, silicided regions 23a to 23d, 27c, 27d, 28c, 28d are formed. Unreacted high-melting-point metal film is removed (FIG. 18). Subsequently, an interlayer insulating film 22, a bit line 14, a storage node 15, an electrode 16 opposed to the storage node 15, and interconnect lines 17 to 21 are sequentially formed (FIG. 19). In general, an N-type MOSFET is often used for a memory cell in a memory device, and a P-type MOSFET is often used for a peripheral circuit such as a sense amplifier. Thus, the storage node 15, the bit line 14 and others are shown in FIG. 19 only for the N-type MOSFET in the memory device region.

The technique disclosed in Japanese Patent Application Laid-Open No. P01-264257A employs the salicide formation method in the manufacture of the MOSFETs in both the logic device region and the memory device region, and therefore requires a smaller number of process steps than a technique which employs both the salicide formation method and the polycide formation method, thereby being capable of performing silicidation relatively easily.

In this method, however, which part of the source/drain diffusion regions is to be silicided depends on which part of the gate insulating films 4a to 4d is to be removed.

The gate insulating films 4a to 4d which are in general thinner than the gate electrodes 3a to 3d are prone to be removed together when the sidewalls 6 are formed by the RIE process. It is very difficult to control an RIE unit so that the gate insulating films 4a and 4b are left unetched in the memory device region but the gate insulating films 4c and 4d are partially etched away in the logic device region. Such a problem might be encountered when other dry etching processes and wet etching processes are employed.

A structural problem arises in addition to the problem in terms of the manufacturing method. MOSFETs manufactured by this manufacturing method are similar in construction to those of the background art shown in FIGS. 10A and 10B. Problematic herein is the silicidation of the gate electrode of the MOSFET used for a memory cell. This problem is described using the MOSFETs of FIG. 19 as an example. Since the gate electrode 3a having the entirely silicided surface has a low gate resistance, electric charges stored in the storage node 15 are liable to flow through the interlayer insulating film 22 into the silicided region 23a to generate a new leakage current (as indicated by the arrow Z). Such a leakage current, similar to the above-mentioned leakage current from the diffusion region to the substrate, causes the electric charges to flow out of the storage node 15 to decrease the ability of the capacitor to hold information.

An additional consideration with the construction of the MOSFET used for the memory cell is described below. The MOSFETs of FIG. 19 taken as an example in which the diffusion region 7a that is not connected to the storage node 15 is connected to the bit line 14 do not have the problem of the decrease in the information holding ability due to the leakage current. As a matter of fact, silicidation of the diffusion region 7a of FIG. 19 is rather better for the purpose of decreasing the resistance thereof

SUMMARY OF THE INVENTION

According to a first aspect of the present invention, a field effect transistor comprises: a semiconductor substrate having a surface; first and second diffusion regions formed in the surface of the semiconductor substrate in spaced apart relationship with each other; a gate insulating film formed on the surface of the semiconductor substrate between the first and second diffusion regions; a gate electrode opposed to the surface of the semiconductor substrate with the gate insulating film therebetween and containing a semiconductor, the gate electrode having a region of a compound of the semiconductor and metal formed partially in a surface of the gate electrode which is farther from the semiconductor substrate at a position far from the second diffusion region; and a capacitor having a storage node connected to the second diffusion region.

According to a second aspect of the present invention, a field effect transistor comprises: a semiconductor substrate having a surface; a pair of diffusion regions formed in the surface of the semiconductor substrate in spaced apart relationship with each other, only one of the pair of diffusion regions having a region of a compound of metal formed in the surface of the semiconductor substrate; a gate insulating film formed on the surface of the semiconductor substrate between the pair of diffusion regions; a gate electrode opposed to the surface of the semiconductor substrate with the gate insulating film therebetween; an interconnect line connected through the region of the compound to the one of the pair of diffusion regions; and a capacitor having a storage node connected to the other of the pair of diffusion regions.

According to a third aspect of the present invention, a method of manufacturing a field effect transistor comprises the steps of: (a) preparing a semiconductor substrate having a surface; (b) forming an insulating film on the surface of the semiconductor substrate; (c) forming a conductive material to cover the insulating film; (d) patterning the conductive material and the insulating film to form a MOS gate; (e) implanting an impurity into the surface of the semiconductor substrate around the MOS gate to form first and second diffusion regions; (f) forming a mask exposing at least one of the first diffusion region and part of the conductive material which is far from the second diffusion region; (g) forming a metal film over the surface of the semiconductor substrate using the mask; and (h) heating the metal film to form a compound of the metal and the at least one of the first diffusion region and the part of the conductive material which is far from the second diffusion region.

Preferably, according to a fourth aspect of the present invention, the method of the third aspect further comprises the steps of: (i) forming an insulating material over a surface of a resultant structure provided in the step (e); (j) etching back the insulating material to leave the insulating material around the MOS gate as a sidewall; and (k) implanting an impurity into the surface of the semiconductor substrate using the MOS gate and the sidewall as a mask to form third and fourth diffusion regions, the steps (i) to (k) being performed between the steps (e) and (f).

The field effect transistor in accordance with the first aspect of the present invention, in which the region of the compound of semiconductor and metal is not provided in part of the gate electrode which is close to the second diffusion region, renders a leakage current difficult to flow between the storage node and the region of the compound. This makes electric charges stored in the storage node difficult to flow out, to prevent the decrease in the ability of the capacitor to hold information.

The field effect transistor in accordance with the second aspect of the present invention, in which the region of the compound of semiconductor and metal is formed in the surface of the one of the pair of diffusion regions, decreases the parasitic resistance of an interconnect line. The absence of the region of the compound in the surface of the other diffusion region suppresses the leakage current in the other diffusion region, to allow less electric charges stored in the capacitor to be impaired. Therefore, a signal based on the electric charges stored in the capacitor may propagate through the interconnect line efficiently.

The method of manufacturing the field effect transistor in accordance with the third aspect of the present invention may be used to manufacture the field effect transistor of the first or second aspect.

The method of manufacturing the field effect transistor in accordance with the fourth aspect of the present invention may be used to manufacture the field effect transistor of the first or second aspect which has an LDD structure without the difficulty in controlling the formation of the sidewall so as not to etch away the insulating film for the MOS gate since the insulating film for the MOS gate is not used as a mask for the formation of the region of the compound.

It is therefore an object of the present invention to provide a MOSFET which has a silicided electrode portion and yet prevents a leakage current from generating between a storage node and a gate electrode, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
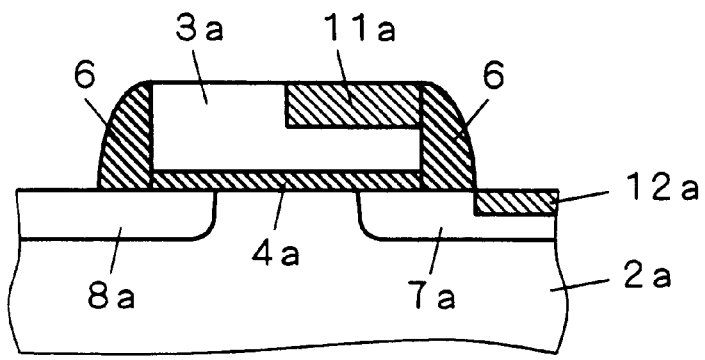
FIGS. 1 through 3 show structures of a MOSFET according to a first preferred embodiment of the present invention.

FIG. 1 shows a structure of a MOSFET according to a first preferred A embodiment of the present invention. The MOS- FET of FIG. 1 comprises source/drain diffusion regions 7a and 8a (which are assumed to be connected to a bit line and a storage node, respectively) formed in a well 2a on a semiconductor substrate, a gate insulating film 4a formed on the surface of the semiconductor substrate, and a gate electrode 3a mainly containing polycrystalline silicon and formed on the gate insulating film 4a. Sidewalls 6 are formed on the side surfaces of the gate electrode 3a. A silicided region 11a is formed in part of the surface of the gate electrode 3a which is far from the diffusion region 8a connected to the storage node. A silicided region 12a is formed in the surface of the diffusion region 7a connected to the bit line.

The silicided regions may be made of a material such as molybdenum, titanium and the like in addition to the conventional material such as cobalt, nickel and tungsten. Titanium, however, might decompose, for example, an interlayer insulating film on the gate electrode because of its property of reducing an oxide. On the other hand, cobalt, nickel and tungsten which are oxidative metals are desirably used.

Additionally, cobalt silicide and nickel silicide have a resistivity as low as about 2 to about 3 Ω/□ which is one-fourth to one-tenth the sheet resistance of tungsten silicide when used for the gate electrode. It is hence desirable to use cobalt silicide and nickel silicide in terms of high driving capability.

The use of the MOSFET of the first preferred embodiment, in which no silicided region is provided in part of the surface of the gate electrode 3a which is close to the storage node connected to the diffusion region 8a, makes it difficult to cause a leakage current to flow between the storage node and the silicided region 11a on the gate electrode. This renders electric charges stored in the storage node difficult to flow out, to prevent the decrease in the ability of a capacitor to hold information. Additionally, since the source/drain diffusion regions are designed such that the diffusion region 7a connected to the bit line is silicided whereas the diffusion region 8a connected to the storage node is not silicided, a parasitic resistance in the diffusion region 7a decreases to render a signal from or to the bit line difficult to attenuate, and a leakage current flowing into the semiconductor substrate is suppressed in the diffusion region 8a to allow less electric charges stored in the capacitor to be impaired. Therefore, a signal based on the electric charges stored in the capacitor efficiently propagates through the bit line via a channel of the MOSFET.

Figure 2:
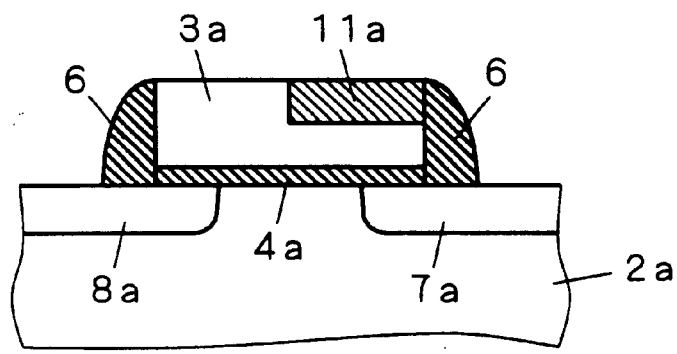

When the problem of the attenuation of the signal through the bit line does not exist, the MOSFET may be constructed as shown in FIG. 2 in which the silicided region 11a is formed only in the gate electrode 3a but no silicided regions are formed in the source/drain diffusion regions 7a and 8a. When the problem of the decrease in the ability of the capacitor to hold information does not exist, the MOSFET may be constructed as shown in FIG. 3 in which the conventional silicided region 23a is formed in the gate electrode 3a and the silicided region 12a is formed only in the diffusion region 7a connected to the bit line.

The MOSFET according to the first preferred embodiment is also effective in applications to a single memory device such as a DRAM, as well as the hybrid logic-memory device.

Figure 3:
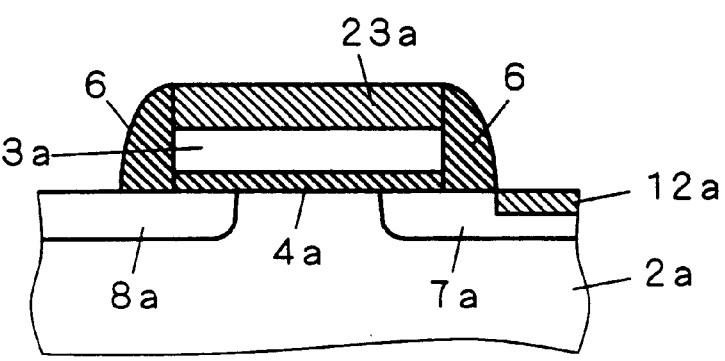

Although not shown in FIGS. 1 through 3, the MOSFET of the first preferred embodiment may have an LDD structure. When the LDD structure is formed only on the drain side, a diffusion region of the same conductivity type as the source/drain diffusion region 7a and having an impurity concentration lower than that of the source/drain diffusion region 7a may be formed in contact with the source/drain diffusion region 7a and in spaced apart relationship with the source/drain diffusion region 8a. Similarly, the LDD structure may be formed on the source side.

Second Preferred Embodiment

Figure 11:
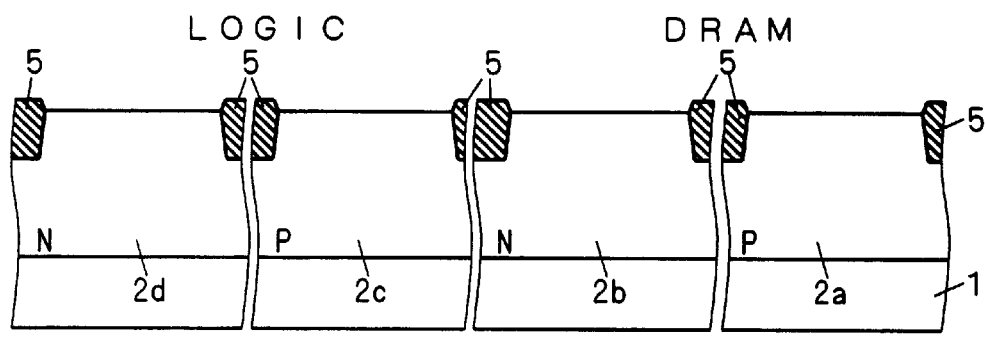
FIGS. 11 through 16 show a background art method of manufacturing MOSFETs.
Figure 12:
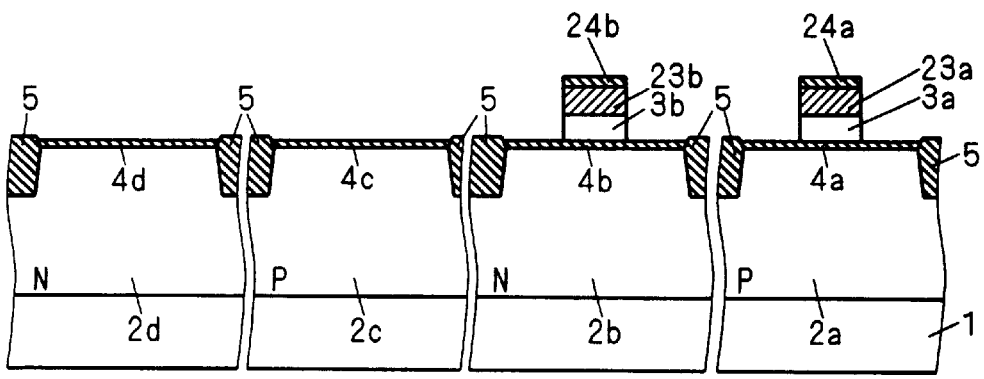
Figure 13:
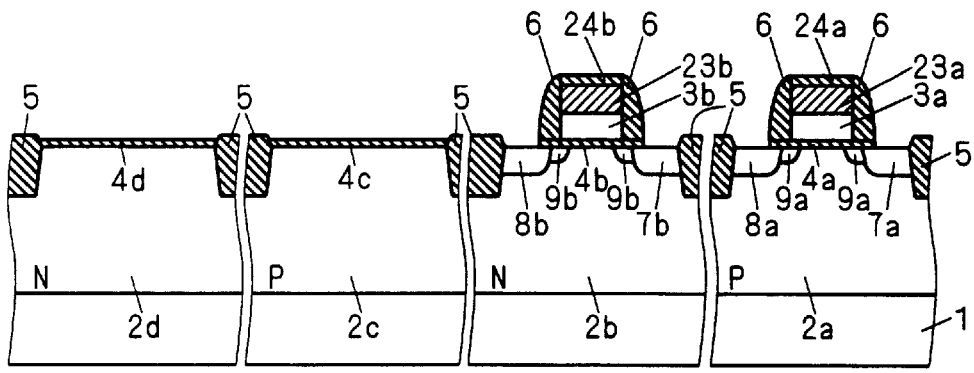
Figure 14:
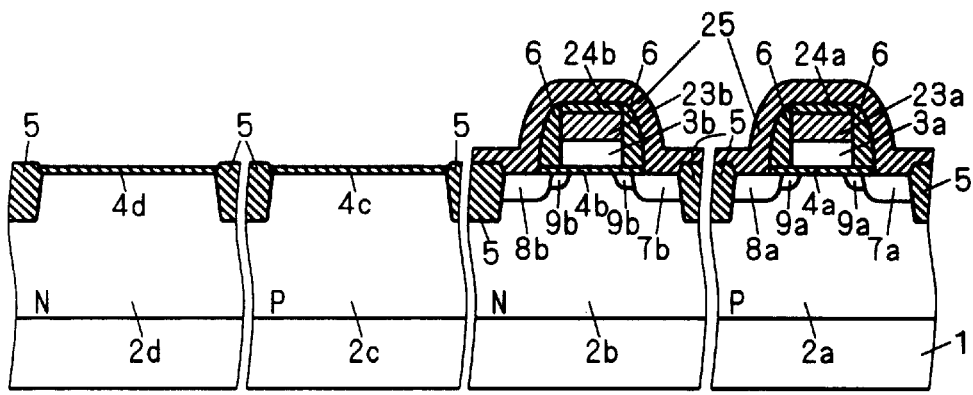
Figure 15:
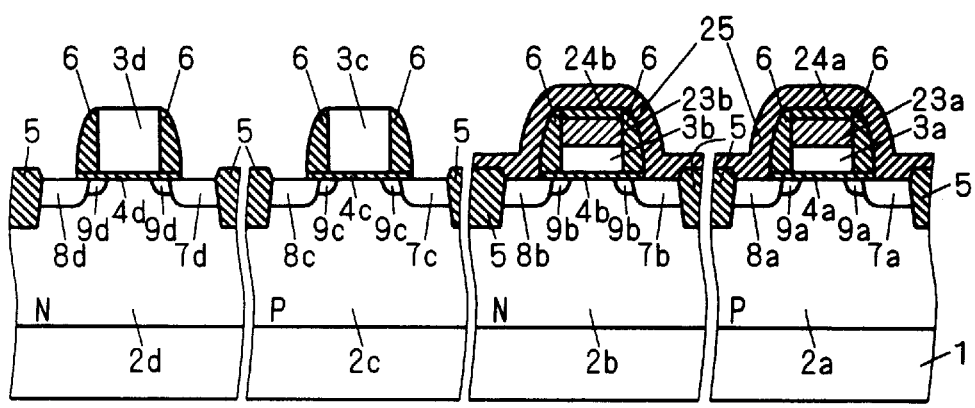
Figure 16:
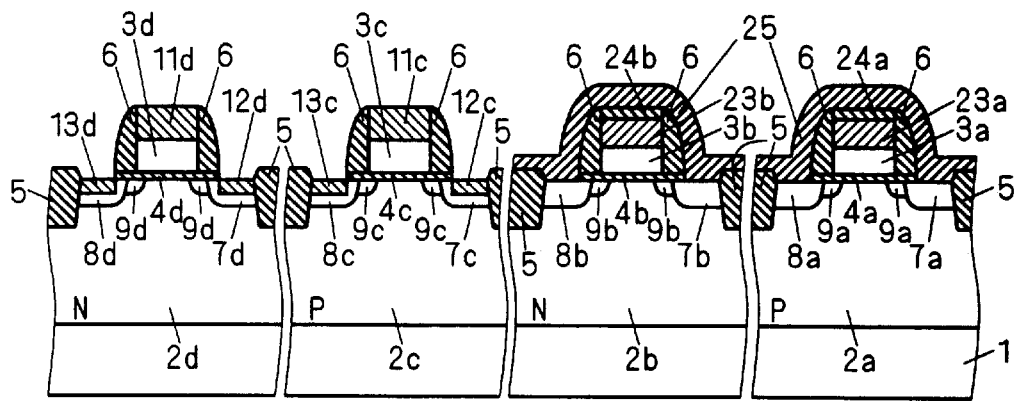
Figure 17:
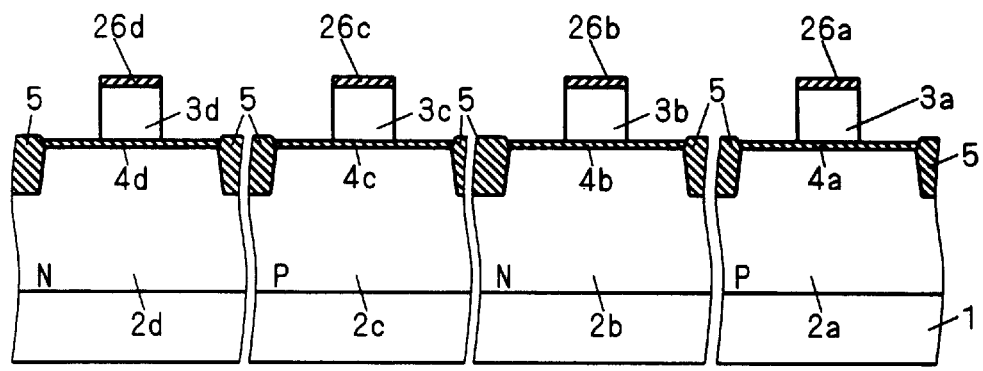
FIGS. 17 through 19 show another background art method of manufacturing MOSFETs.
Figure 18:
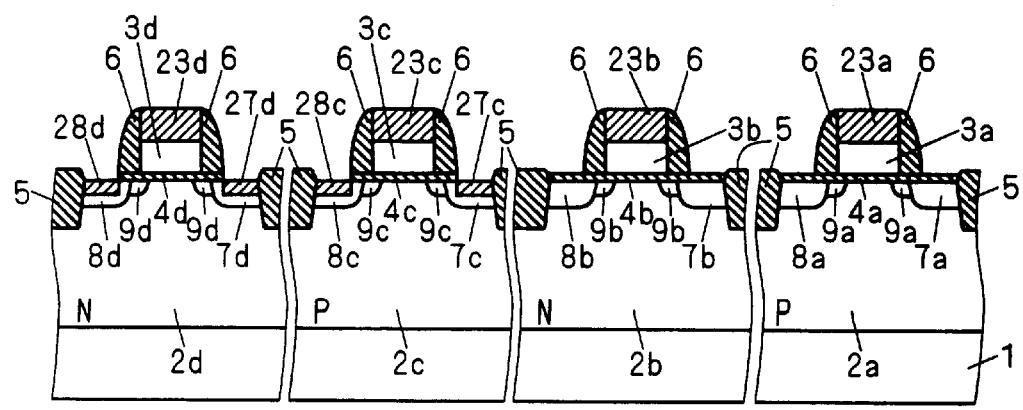
Figure 19:
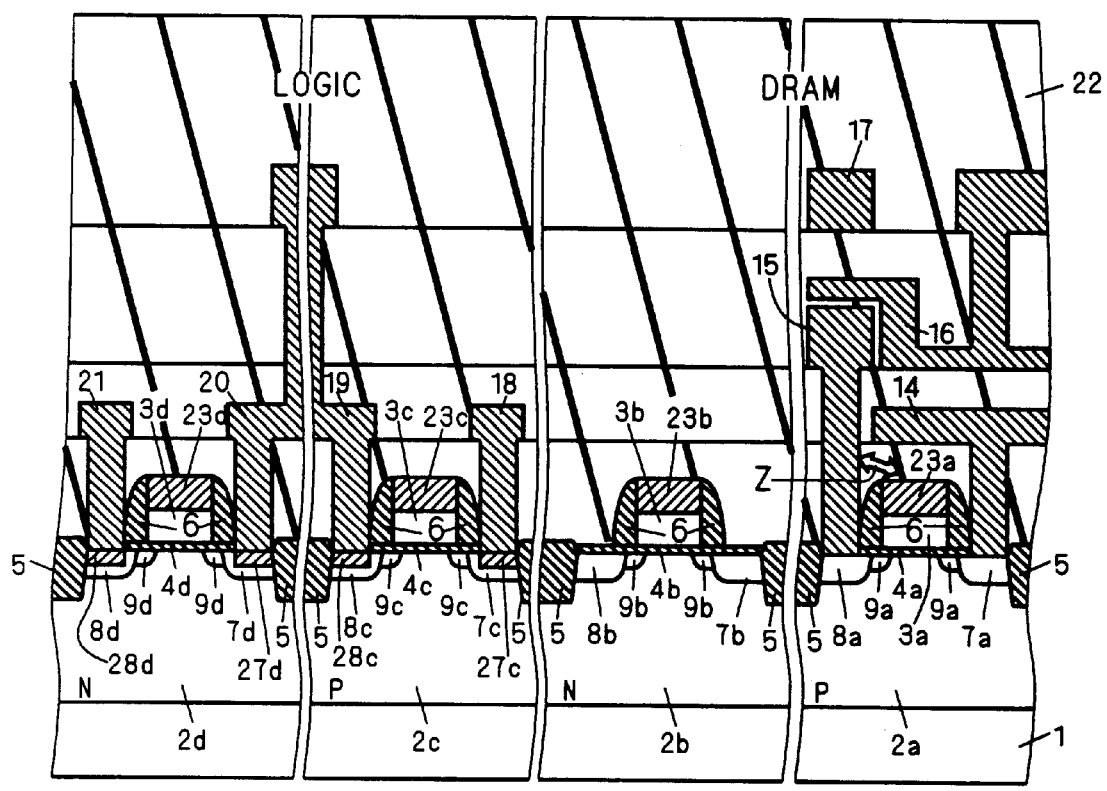

FIGS. 4, 5, 6A, 6B, 7, 8 and 9 show a method of manufacturing the MOSFET shown in FIG. 1. Initially, the structure shown in FIG. 11 is manufactured by the conventional method. Specifically, isolation regions 5, P-type wells 2a, 2c and N-type wells 2b, 2d are formed at the surface of a semiconductor substrate 1. An oxide film having a thickness of 3 to 15 nm is formed on the surface of the wells 2a to 2d by thermal oxidation. Impurity-free polycrystalline silicon having a thickness on the order of 100 to 150 nm is deposited on the entire surface of the semiconductor substrate 1 by the LPCVD process.

A photoresist is formed on the surface of the polycrystalline silicon and patterned so that the polycrystalline silicon is exposed only on the P-type well 2a in a memory device region and on the P-type well 2c in a logic device region. The polycrystalline silicon is implanted, e.g., with phosphorus by the ion implantation process at a dose of not less than $1.0 \times 10^{15}$ ions/cm$^2$ to change the exposed parts into N-type polycrystalline silicon.

The photoresist is removed, and a new photoresist is formed and patterned so that the polycrystalline silicon is exposed only on the N-type well 2b in the memory device region and on the N-type well 2d in the logic device region. The polycrystalline silicon is implanted, e.g., with boron by the ion implantation process at a dose of not less than $1.0 \times 10^{15}$ ions/cm$^2$ to change the exposed parts into P-type polycrystalline silicon.

Figure 4:
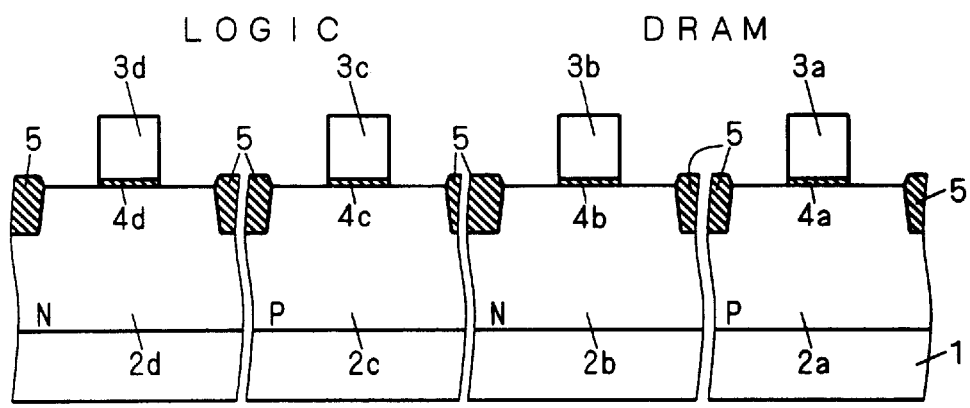
FIGS. 4, 5, 6A, 6B, 7, 8 and 9 show a method of manufacturing the MOSFET according to a second preferred embodiment of the present invention.

The photoresist is removed, and a new photoresist is formed and patterned for gate electrode shaping. Gate electrodes 3a to 3d are formed by etching. Subsequently, the oxide film is also etched to form gate insulating films 4a to 4d (FIG. 4). The gate electrodes 3a and 3c are of N$^+$ type, and the gate electrodes 3b and 3d are of P$^+$ type.

A photoresist is formed and patterned so as to cover the N-type wells 2b and 2d. Phosphorus, for example, is implanted into the surfaces of the P-type wells 2a and 2c by the ion implantation process at a dose on the order of $1.0 \times 10^{13}$ to $4.0 \times 10^{13}$ ions/cm$^2$ and at an energy of 15 to 70 keV to form N$^-$ source/drain diffusion regions 9a and 9c. The photoresist is removed, and a new photoresist is formed and patterned so as to cover the P-type wells 2a and 2c. Boron, for example, is implanted into the surfaces of the N-type wells 2b and 2d by the ion implantation process at a dose on the order of $1.0 \times 10^{13}$ to $4.0 \times 10^{13}$ ions/cm$^2$ and at an energy of 5 to 30 keV to form P$^-$ source/drain diffusion regions 9b and 9d. The photoresist is removed. An oxide film having a thickness on the order of 50 to 100 nm is deposited on the entire surface of the semiconductor substrate 1 and is then etched back to form the sidewalls 6 on the side surfaces of the gate electrodes 3a to 3d.

Figure 5:
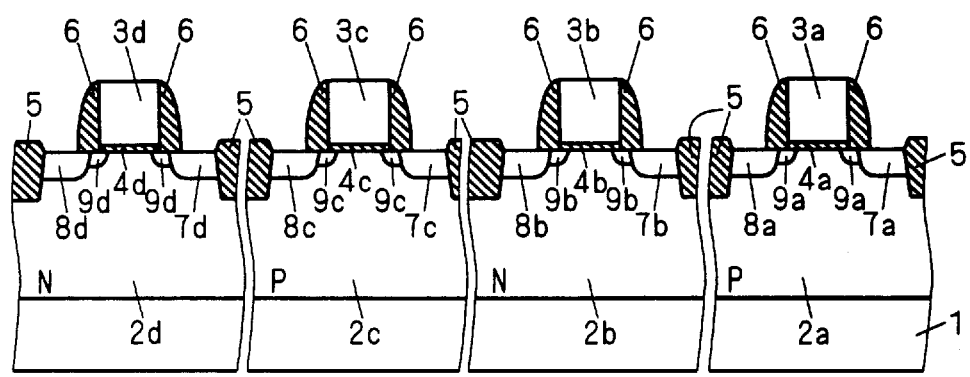

A photoresist is formed again on the surface of the semiconductor substrate 1 and patterned so as to cover the N-type wells 2b and 2d. Phosphorus, for example, is implanted into the surfaces of the P-type wells 2a and 2c by the ion implantation process at a dose of not less than $1.0 \times 10^{15}$ ions/cm$^2$ and at an energy of 15 to 70 keV to form N$^+$ source/drain diffusion regions 7a, 7c, 8a, 8c. The photoresist is removed, and a new photoresist is formed and patterned so as to cover the P-type wells 2a and 2c. Boron, for example, is implanted into the surfaces of the N-type wells 2b and 2d by the ion implantation process at a dose of not less than $1.0\times10^{15}$ ions/cm$^2$ and at an energy of 5 to 30 keV to form P$^+$source/drain diffusion regions 7b, 7d, 8b, 8d (FIG. 5). The source/drain diffusion regions 7a, 8a and 9a; 7b, 8b and 9b; 7c, 8c and 9c; and 7d, 8d and 9d constitute respective LDD structures.

Figure 6A:
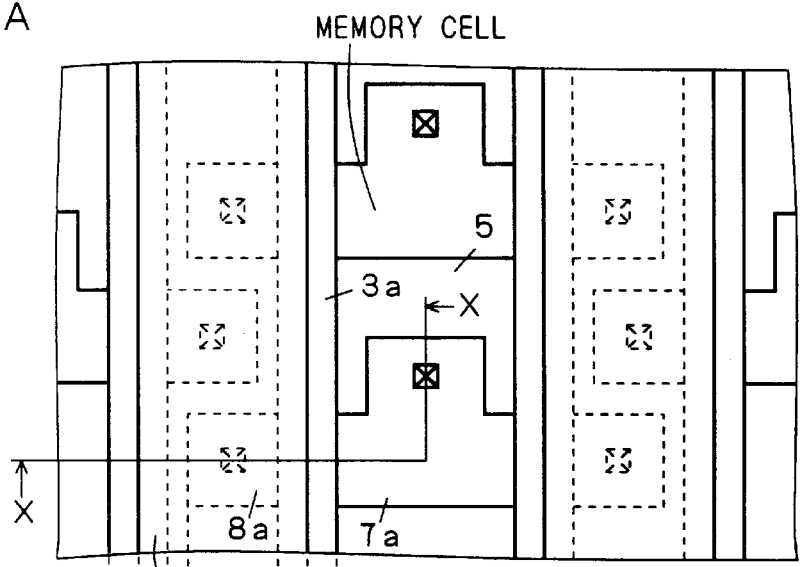
Figure 6B:
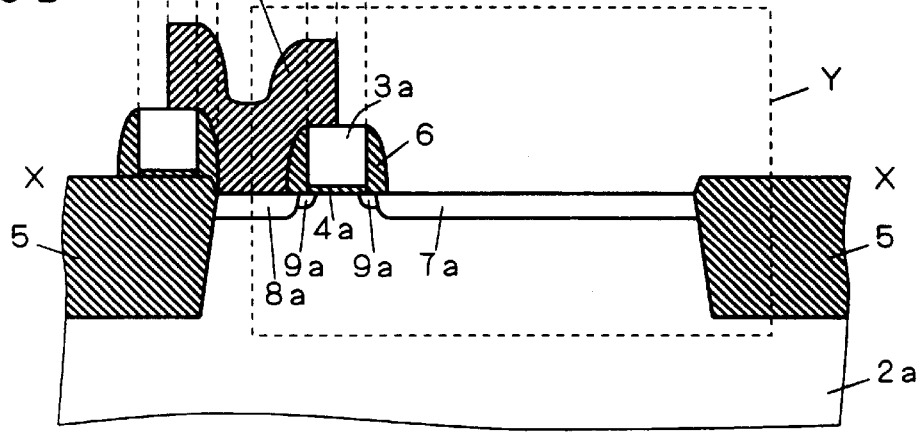
Figure 7:
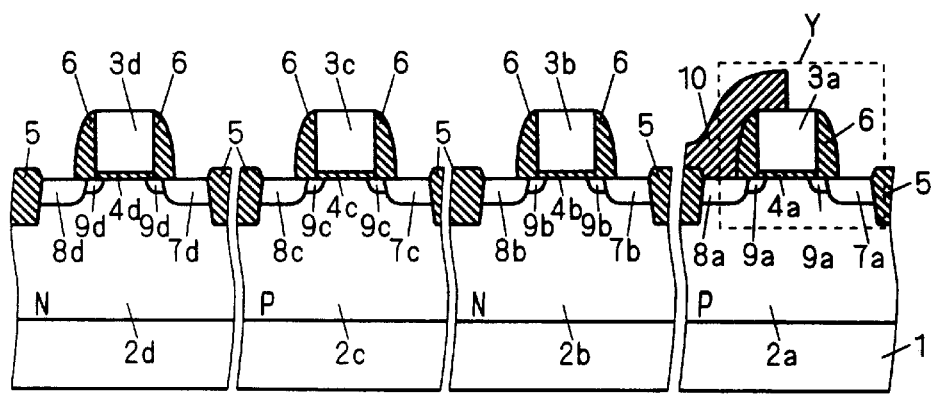

Next, the source/drain diffusion region connected to the storage node and part of the gate electrode in the MOSFET used for a memory cell are covered with a silicon nitride film serving as a mask against silicidation. More specifically, a photoresist is patterned, and a silicon nitride film 10 having a thickness on the order of 50 to 100 nm is formed on part of the memory cell in which the diffusion region 8a connected to the storage node is present and on part of the gate electrode 3a which is closer to the storage node. The photoresist is then removed. FIGS. 6A and 6B show the silicon nitride film 10 formed in the memory device region including a plurality of memory cells comprised of the gate electrode 3a and the source/drain diffusion regions 7a and 8a. FIG. 6A is a top plan view of the memory device region, and FIG. 6B is a cross-sectional view taken along the lines X—X of FIG. 6A. It will be found from FIGS. 6A and 6B that the silicon nitride film 10 functions as a mask. FIG. 7 shows a peripheral circuit and the MOSFETs in the logic device region in addition to the structure of FIG. 6B after the silicon nitride film 10 is formed. A region Y shown in FIG. 7 is the same as the region Y of FIG. 6B. As illustrated in FIG. 7, the silicon nitride film 10 is formed only in the MOSFET serving as a memory cell.

Figure 8:
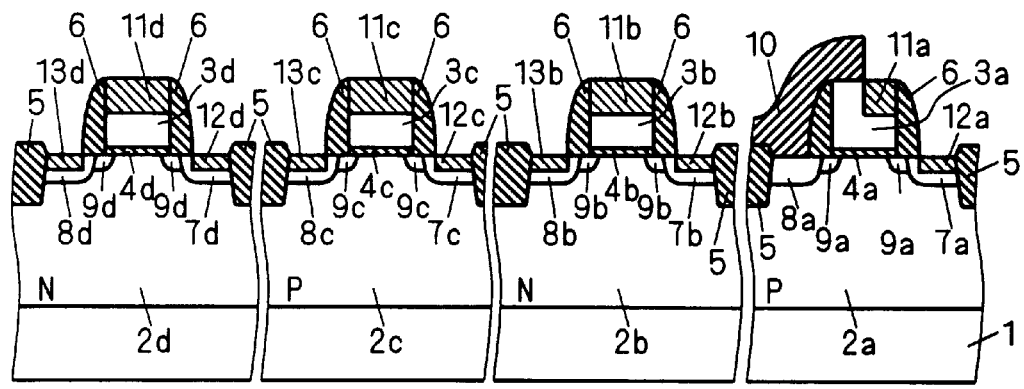
Figure 9:
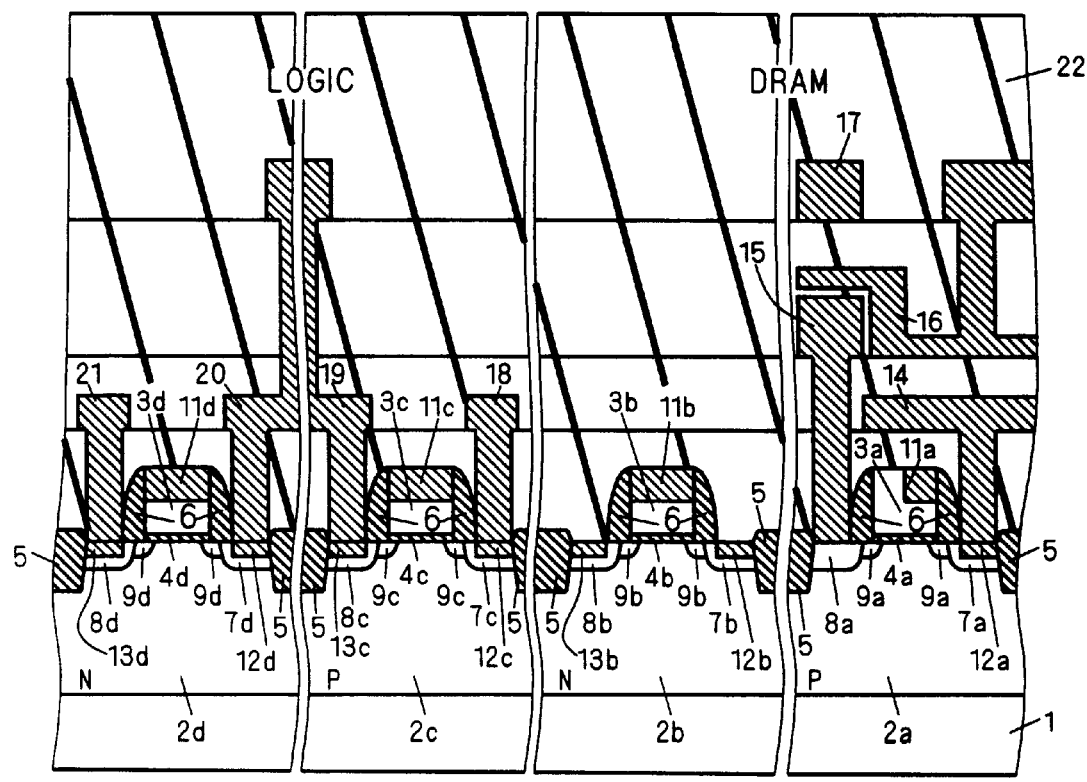
Figure 10B:
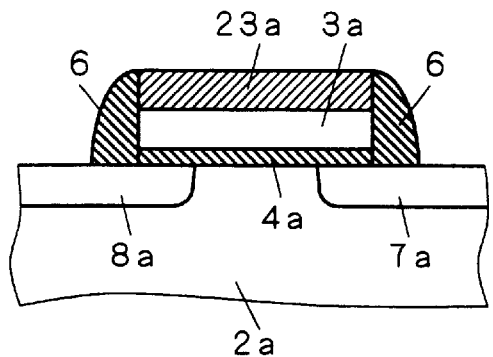
FIGS. 10A and 10B show structures of background art MOSFETs.
Figure 10A:
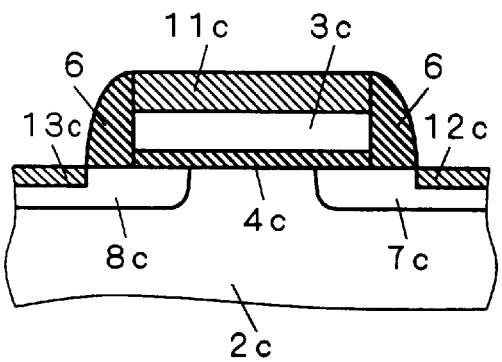

Next, cobalt having a thickness on the order of 5 to 20 nm, for example, is deposited on the surface of the semiconductor substrate 1 by sputtering. Heat treatment is performed, and unreacted cobalt is removed. Heat treatment is performed again to silicide the surfaces of the gate electrodes 3b to 3d of the P-type MOSFET constituting a peripheral circuit portion in the memory region and the MOSFET in the logic device region, the surfaces of the source/drain diffusion regions 7b to 7d and 8b to 8d, part of the surface of the gate electrode 3a of the N-type MOSFET in a memory cell portion in the memory device region, which part is far from the storage node 15, and the surface of the source/drain diffusion region 7a which is not connected to the storage node. Thus, silicided regions 11a to 11d, 12a to 12d, and 13b to 13d are formed by the reaction of cobalt and silicon (FIG. 8). Thereafter, the silicon nitride film 10 is removed. An interlayer insulating film 22, a bit line 14, a storage node 15, an electrode 16 opposed to the storage node 15, and interconnect lines 17 to 21 are sequentially formed (FIG. 9).

According to the method of manufacturing the MOSFET of the second preferred embodiment, the use of the salicide formation method also in the memory device region allows the use of cobalt silicide and nickel silicide having a low resistivity in the MOSFETs for the memory device. Additionally, this method can perform silicidation relatively easily as compared with a method employing both the polycide formation method and the salicide formation method. Therefore, this method can manufacture the MOSFET of the first preferred embodiment. Furthermore, this method does not use the gate insulating films 4a to 4d as a mask against silicidation to eliminate the difficulty in controlling an etching unit during the formation of the sidewalls 6 in the manufacture of the MOSFET of the first preferred embodiment having the LDD structure.

For the manufacture of the MOSFETs shown in FIGS. 2 and 3, the patterning of the silicon nitride film 10 may be changed in the method of the second preferred embodiment.

The method of manufacturing the MOSFET according to the second preferred embodiment is also effective in applications to the manufacture of a single memory device such as a DRAM, as well as the manufacture of the hybrid logic-memory device.

While the invention has been described in detail, the foregoing description is in all aspects illustrative and not restrictive. It is understood that numerous other modifications and variations can be devised without departing from the scope of the invention.

What is claimed is:

1. A method of manufacturing a field effect transistor, comprising the steps of:

(a) preparing a semiconductor substrate having a surface;
   (b) forming an insulating film on said surface of said semiconductor substrate;
   (c) forming a conductive material to cover said insulating film;
   (d) patterning said conductive material and said insulating film to form a MOS gate;
   (e) implanting an impurity into said surface of said semiconductor substrate around said MOS gate to form first and second diffusion regions;
   (f) forming a mask so as to expose a part of a top surface of said conductive material which is far from said second diffusion region and to cover a top surface of said second diffusion region;
   (g) forming a metal film over said surface of said semiconductor substrate using said mask;
   (h) heating said metal film to form a compound of said metal film and the part of the top surface of said conductive material which is far from said second diffusion region;
   (i) forming an interlayer insulating film to cover the surface of said semiconductor substrate; and
   (j) forming a capacitor connected to said second diffusion region via said interlayer insulating film.

2. The method according to claim 1, wherein said conductive material is polycrystalline silicon, and said metal film is a cobalt film.

3. The method according to claim 1, wherein said conductive material is polycrystalline silicon, and said metal film is a nickel film.

4. The method according to claim 1, wherein said semiconductor substrate is a silicon substrate, and said metal film is a cobalt film.

5. The method according to claim 1, wherein said semiconductor substrate is a silicon substrate, and said metal film is a nickel film.

6. The method according to claim 1, further comprising the steps of:

(i) forming an insulating material over a surface of a resultant structure provided in said step (e);
   (j) etching back said insulating material to leave said insulating material around said MOS gate as a sidewall; and
   (k) implanting an impurity into said surface of said semiconductor substrate using said MOS gate and said sidewall as a mask to form third and fourth diffusion regions,
   said steps (i) to (k) being performed between said steps (e) and (f).

7. The method according to claim 1, wherein
   in said step (f) said mask is formed so as to expose said first diffusion region; and in said step (h) said compound of said metal film is formed both in said first diffusion region and the part of the top surface of said conductive material which is far from said second diffusion region.

8. A method of manufacturing a field effect transistor, comprising the steps of:
   a) preparing a semiconductor substrate having a surface;
   (b) forming an insulating film on said surface of said semiconductor substrate:
   (c) forming a conductive material to cover said insulating film;
   (d) patterning said conductive material and said insulating film to form a MOS gate;
   (e) implanting an impurity into said surface of said semiconductor substrate around said MOS gate to form first and second diffusion regions;
   (f) forming a mask so as to expose said first diffusion region and to cover a top surface of said second diffusion region;
   (g) forming a metal film over said surface of said semiconductor substrate using said mask;
   (h) heating said metal film to form a compound of said metal film and said first diffusion region;
   (i) forming an interlayer insulating film to cover the surface of said semiconductor substrate, and
   (j) forming a capacitor connected to said second diffusion region via said interlayer insulating film.

9. The method according to claim 8, wherein said conductive material is polycrystalline silicon, and said metal film is a cobalt film.

10. The method according to claim 8, wherein said conductive material is polycrystalline silicon, and said metal film is a nickel film.

11. The method according to claim 8, wherein said semiconductor substrate is a silicon substrate, and said metal film is a cobalt film.

12. The method according to claim 8, wherein said semiconductor substrate is a silicon substrate, and said metal film is a nickel film.

13. The method according to claim, 8, further comprising the steps of:
   (k) forming an insulating material over a surface of a resultant structure provided in step (e);
   (l) etching back said insulating material to leave said insulating material around said MOS gate as a sidewall; and
   (m) implanting an impurity into said surface of said semiconductor substrate using said MOS gate and said sidewall as a mask to form third and fourth diffusion regions,
   said steps (k) to (m) being performed between said steps (e) and (f).

* * * * *